United States Patent
Kerselaers

(10) Patent No.: US 8,170,511 B2
(45) Date of Patent: May 1, 2012

(54) EQUALIZER SYSTEM FOR EMITTING A QUASI-CONSTANT POWER OUTPUT RF SIGNAL IN A FREQUENCY BAND

(75) Inventor: Anthony Kerselaers, Herselt (BE)

(73) Assignee: ST-Ericsson SA, Geneva (CH)

( * ) Notice: Subject to any disclaimer, the term of this patent is extended or adjusted under 35 U.S.C. 154(b) by 290 days.

(21) Appl. No.: 12/310,220

(22) PCT Filed: Aug. 10, 2007

(86) PCT No.: PCT/IB2007/053189
§ 371 (c)(1),
(2), (4) Date: Jun. 29, 2009

(87) PCT Pub. No.: WO2008/020383
PCT Pub. Date: Feb. 21, 2008

(65) Prior Publication Data
US 2010/0015933 A1    Jan. 21, 2010

(30) Foreign Application Priority Data
Aug. 14, 2006    (EP) .................................... 06118850

(51) Int. Cl.
*H04B 1/04* (2006.01)
*H03H 7/30* (2006.01)
(52) U.S. Cl. ......................... 455/126; 455/307; 375/229
(58) Field of Classification Search ................. 455/126, 455/127.1–127.5; 375/229–236
See application file for complete search history.

(56) References Cited

U.S. PATENT DOCUMENTS

| | | | |
|---|---|---|---|
| 2,855,508 A * | 10/1958 | Linden et al. | 455/101 |
| 5,907,242 A * | 5/1999 | Gard | 455/286 |
| 6,023,611 A * | 2/2000 | Bolin et al. | 455/114.1 |
| 6,335,663 B1 * | 1/2002 | Satoh et al. | 333/126 |
| 2004/0121748 A1 | 6/2004 | Glaza | |
| 2004/0219891 A1 * | 11/2004 | Hadjichristos | 455/102 |
| 2007/0146212 A1 * | 6/2007 | Ozden et al. | 343/702 |
| 2009/0002095 A1 * | 1/2009 | Terada et al. | 333/133 |

FOREIGN PATENT DOCUMENTS

| | | | |
|---|---|---|---|
| EP | 998036 A1 * | 5/2000 | |
| WO | WO 00/52984 A1 | 9/2000 | |
| WO | WO 2004/100396 A1 | 11/2004 | |

OTHER PUBLICATIONS

International Search Report dated Feb. 1, 2008 in connection with PCT Patent Application No. PCT/IB2007/053189.

* cited by examiner

*Primary Examiner* — Lana N Le

(57) ABSTRACT

The invention refers to an equalizer system for emitting a quasi-constant power output RF signal in a first frequency band, the system comprising a programmable RF signal generator (10) for providing a modulated signal; a variable gain amplifier (40) for receiving the modulated signal and generating a RF signal to an antenna (70). The system further comprises a sensing devices (60, 61, 62) for providing a sensing signal which is either a signal proportional with the RF signal or a signal proportional with a supply current of the variable gain amplifier and a user interface (110) for determining an initial RF frequency signal and adjusting circuit (100) for providing a control signal to the variable gain amplifier (40) based on the initial RF frequency signal and the sensing signal, the adjusting circuit (100) comprising an arithmetic unit for calculating a value of the control signal.

5 Claims, 3 Drawing Sheets

EQUALIZER SYSTEM FOR EMITTING A QUASI-CONSTANT POWER OUTPUT RF SIGNAL IN A FREQUENCY BAND

CROSS-REFERENCE TO RELATED APPLICATION(S)

The present application claims priority under 35 U.S.C. §365 to International Patent Application No. PCT/IB2007/053189 filed Aug. 10, 2007, entitled "EQUALIZER SYSTEM FOR EMITTING A QUAS I-CONSTANT POWER OUTPUT RF SIGNAL IN A FREQUENCY BAND". International Patent Application No. PCT/IB2007/053189 claims priority under 35 U.S.C. §365 and/or 35 U.S.C. §119(a) to European Patent Application No. 06118850.4 filed Aug. 14, 2006 and which are incorporated herein by reference into the present disclosure as if fully set forth herein.

FIELD OF THE INVENTION

The invention relates to an equalizer and to a transmitter adapted to use such an equalizer.

BACKGROUND OF THE INVENTION

Equalizers are known devices used to correct typically the non-linearity of devices such that a transfer function becomes almost linear in a certain range of interest. Such an application is a transmitting device for transmitting audio content to a FM receiver within a short range e.g. several meters in a standard broadcasting range as 88-108 MHz. In such an application it is important that the transmission power is very low as e.g. 11 nW in US.

Throughout the present application we consider that the term "small antenna" refers to an antenna having its physical dimensions much smaller that the wavelength of the signal transmitted via said antenna i.e. the carrier. Let us observe that in known broadcasting systems the antenna dimensions is a fraction of the wavelength of the carrier e.g. ¼, and that in this application we refer to antenna as small as $\frac{1}{10}$ or less of the wavelength of the carrier. The problem with small antennas is that they have a very low radiation resistance, which determines in practice a very low efficiency. For example a full size dipole antenna having a length of two times 750 mm and operating at 95 MHz with 50-ohm source impedance has an efficiency of 95% and a source voltage of 200 mV will generate a maximum effective radiated power 100 µW. If we consider a short dipole of two times 50 mm, loaded with coils, we obtain an efficiency of 0.32% depending on the quality factor of the antenna and the position of the coils, the antenna generating an effective radiated power of 250 nW. The radiation resistance for the full size dipole is 70 ohms while the radiation resistance for the short dipole is 0.0052 ohm. Since some kind of electrically loading is required for the short antenna, the antenna becomes narrowband. This is the reason why this kind of antenna radiates a different amount of power at different frequencies.

If this problem is not solved the received signal strength by a FM radio for frequencies besides the resonance frequency is too low for good quality reception and noise will be introduced in the audio signal or it can happen that the received signal will not be detected by the FM radio.

SUMMARY OF THE INVENTION

Hence, it is a need to provide an equalizer system suitable for use in low range and low power communication. The invention is defined by the independent claims. Dependent claims define advantageous embodiments.

This object is achieved in an equalizer system for emitting a quasi-constant power output RF signal in a first frequency band comprising:

a programmable RF signal generator for providing a modulated signal;

a variable gain amplifier for receiving the modulated signal and generating a RF signal to an antenna;

a sensing devices for providing a sensing signal which is either a signal proportional with the RF signal or a signal proportional with a supply current of the variable gain amplifier;

an user interface for determining an initial RF frequency signal; and an adjusting circuit for providing a control signal to the variable gain amplifier based on the initial RF frequency signal and the sensing signal, the adjusting circuit comprising an arithmetic unit for calculating a value of the control signal. A user selects the transmit frequency by means of the user interface. At the start of a transmission the sensing device measures the antenna current. The effective radiated power equals the radiation resistance times the antenna current in square i.e. $ERP = Rrad \times Iant^2$. The radiation resistance in function of frequency is fairly constant for short antennas and therefore the effective radiated power can be calculated in the adjusting circuit by the arithmetic unit. From this calculation the output power is set to that level that is required for that frequency. Furthermore it a relation between the radiated power Prad and radiated field strength in free space, which is $Prad = (Radiated\ Field\ strength)^2 \times distance^2 / 70$. Hence, starting from any of the above relations a control signal is determined and sent to the variable gain amplifier. Similar relations may be obtained for the dependence between the supplied current to the variable gain amplifier and the adjusting circuit generates control signals to the variable gain amplifier.

In an embodiment of the invention the adjusting circuit comprises a memory circuit for memorizing the control signal corresponding to specific RF signals selected via the user interface. During the testing of the equalizer a table comprising the dependency between the output power of the RF signal and the necessary correction signals can be generated and stored in a memory.

In a preferred embodiment, the equalizer system comprises an analog to digital converter coupled to the adjusting circuit for converting the sensing signal into a digital code.

In another embodiment of the invention the filter circuit has a first resonant circuit at a first resonant frequency inside a first frequency band and at least a second resonant circuit at a second resonant frequency outside said first frequency band for providing the RF signal having a substantial same power in said first frequency band. The word substantial refers to signals differing ±5 db from each other.

The first resonant circuit improves the transmission properties of the system inside the frequency band. The second resonant circuit improves the current through the antenna for the lower frequencies inside the first frequency band where there is a degradation of the power of the RF signal. The resonant circuits may share some of their components and may provide different types of resonance e.g. series or parallel.

In an embodiment of the invention, when the small antenna is a loop antenna the feeding system comprises a first capacitor in parallel with the loop antenna for determining the first resonant frequency. The first capacitor is further coupled in series with a second capacitor for determining the second resonant frequency.

In another embodiment, when the small antenna is a capacitive antenna the feeding system comprises a first capacitor in series with a second capacitor. This series combination is in parallel with an inductor, the inductor being in parallel with the capacitive antenna. The inductor, the first capacitor and the capacitive antenna determines the second resonance frequency and the inductor, the first capacitor, the second capacitor and the capacitive antenna determines the first resonant frequency.

In order to avoid interferences with other transmitters, which may be in the same device comprising the antenna system as e.g. a portable phone, the wherein the feeding circuit comprises band—reject filters having their resonant frequencies in the frequency bands allocated to higher wireless frequency standards.

BRIEF DESCRIPTION OF THE DRAWINGS

The above and other advantages will be apparent from the exemplary description of the accompanying drawings in which.

DETAILED DESCRIPTION OF EMBODIMENTS

Figure 1:
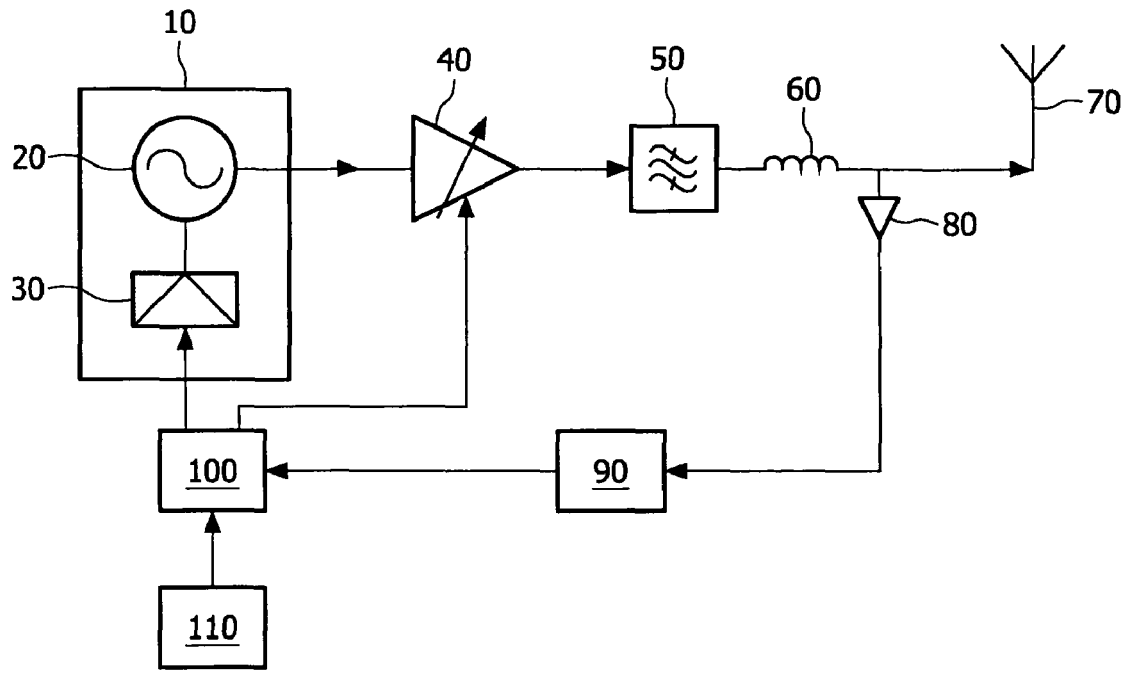
FIG. 1 depicts an embodiment of an equalizer according to the invention.
Figure 2:
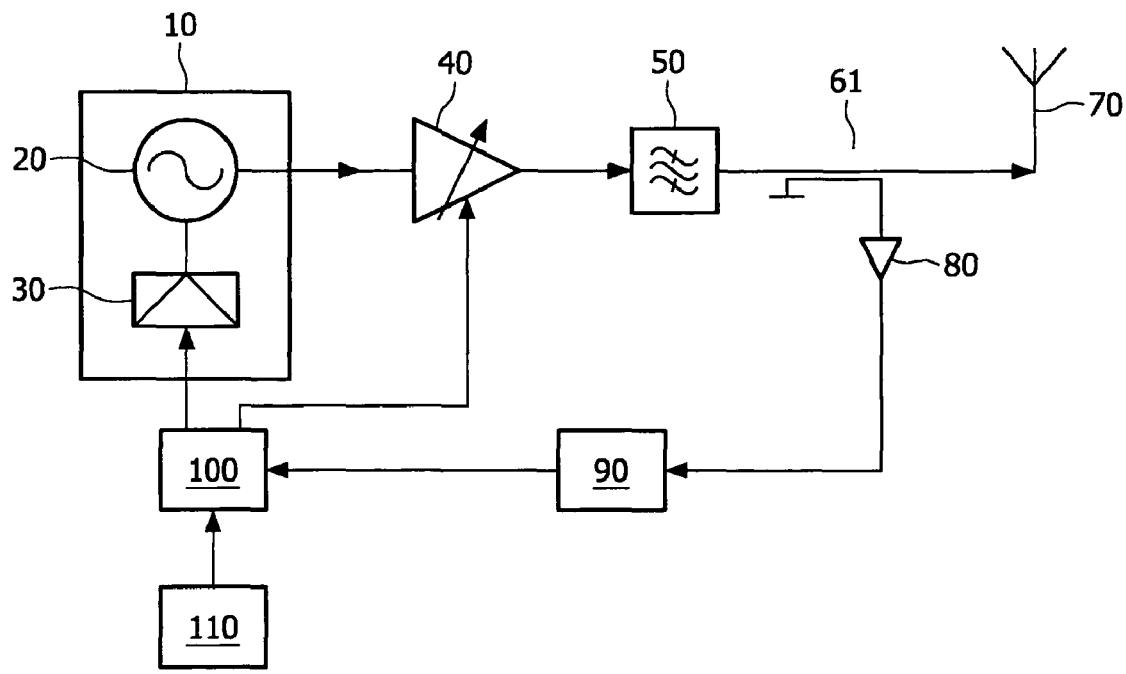
FIG. 2 depicts an embodiment of an equalizer according to the invention.

FIG. 1 and FIG. 2 are embodiments of an equalizer. An audio signal that should to be transmitted is modulated in RF signal generator 10, which may comprise a stereo multiplex mixer-FM modulator 30 and a programmable RF signal oscillator 20. The RF signal oscillator 20 determines the transmit frequency, which is for example in the FM broadcast band. The stereo mixer-FM modulator 30 processes the left and right audio source to a compatible audio signal for a normal broadcast receiver. The FM modulated radio signal from unit 10 is amplified by a variable gain amplifier 40. The amplified radio signal is passed through a filter 50 for removing all unwanted signals, like for example harmonic signals of the transmit frequency. The filtered radio signal is passed trough a current transformator 60 and further to the short antenna 70. The antenna 70 is radiating the radio signal to the broadcast FM receiver. In FIG. 1, the antenna current is for example measured with a current transformator 60. In FIG. 2, the antenna current is for example measured with a coupler element 61 as two conducting tracks on a printed circuit board that are close together. The measured antenna current is amplified and converted to a DC signal in a converter 80. This converter 80 can be a combination of an amplifier and diode detector. The output signal of the converter 80 is digitized in the analog to digital converter 90. The digital code, which is an equivalent of the antenna current, is read in by the micro controller 100. The micro controller 100 may also contain the analog to digital converter 90. The micro controller 100 has also received the transmit frequency from the user interface 110. This is the transmit frequency that is chosen by the user. The micro controller 100 can also be part of the main DSP processor of a larger appliance as e.g. a mobile phone or other mobile device as an MP3 player. The micro controller 100 sets the frequency of the RF signal oscillator in unit 10. The relation between the antenna current and the radiated power is known by the micro controller 100. The micro controller 100 is now able to set the variable output amplifier 40 in that way that the radiated power is relative constant over the frequency range.

For example a phone includes a short capacitive antenna having 40 mm length. The radiating resistance of this antenna at a transmit frequency of 95 Mhz is 31 milli-Ohm The radiation resistance can be found by modern simulation methods with 3 Dimensional Electro Magnetic solvers like from the company Ansoft or CST. The relation between Prad (radiated power) and Iant (antenna current) is $Prad=Rrad \times Iant^2$.

If we want Prad equal to 32 nW, the required antenna current is 1 mA. The relation between Prad and Radiated Field strength in free space is $Prad=(Radiated\ Field\ strength)^2 \times distance^2/70$. If Prad equals 32 nW, then we have a radiated field strength at 3 meter of 54.3 dbuV/m.

For the equalizers shown in FIG. 1 or FIG. 2 the micro controller 100 is setting the output power of the variable gain amplifier 40 in this example that the antenna current is 1 mA. With this setting the radiated field strength at 3-meter distance can be found in table 1.

TABLE 1

| Frequency [MHz] | Radiated field strength [dbuV/meter] at 3 meter distance |
|---|---|
| 80 | 52.9 |
| 90 | 53.9 |
| 100 | 54.8 |
| 110 | 55.6 |

If the output power of the variable gain amplifier is adapted so that the antenna current is linear increased with the frequency, the radiated field strength over a frequency band is more or less equalized. This is because the radiation resistance is slightly linear increasing with the frequency for a capacitive antenna. Example values for the hardware of FIG. 1 and FIG. 2 with this output power settings can be found in Table 3.

TABLE 3

| Frequency [MHz] | Antenna current [mA] | Radiated field strength [dbuV/meter] at 3 meter distance |
|---|---|---|
| 80 | 1 | 52.9 |
| 90 | 0.9 | 53 |
| 100 | 0.8 | 52.8 |
| 110 | 0.7 | 52.5 |

Figure 3:
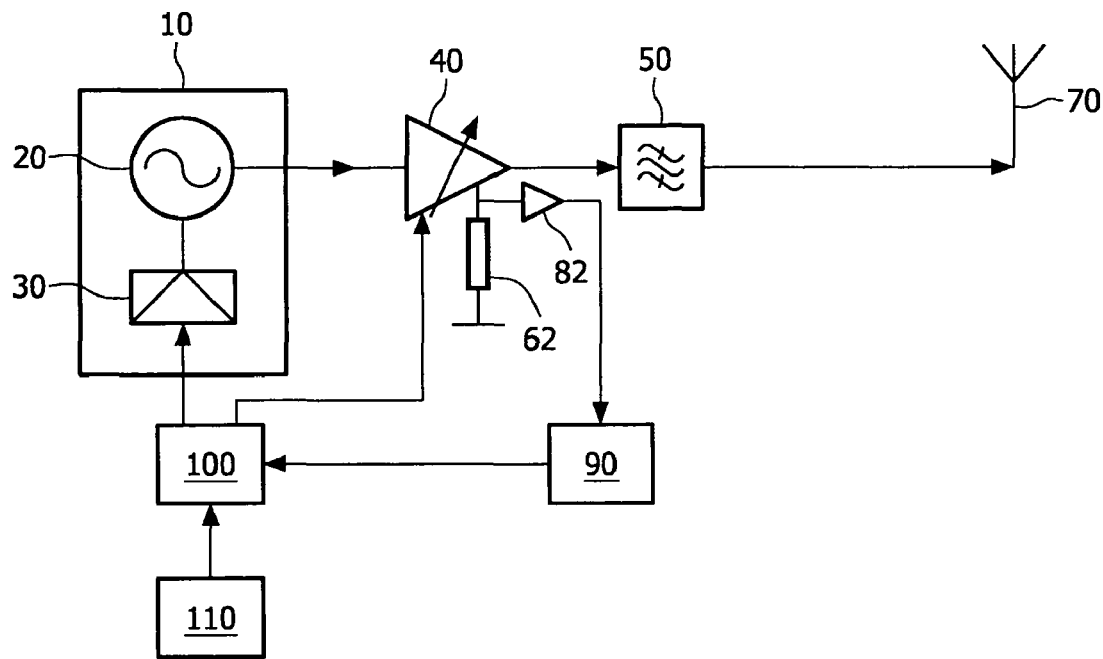
FIG. 3 depicts another embodiment of an equalizer according to the invention.

In FIG. 3, a supply current of the variable gain amplifier is for example measured over a small resistor 62. The measured supply current is amplified and converted to a DC signal in a converter 82. This converter 82 may be a combination of an amplifier and diode detector. The output signal of the converter 82 is digitized in the analog to digital converter 90. The micro controller 100 reads the digital code. The micro controller 100 may also include the analog to digital converter 90.

The micro controller 100 receives the RF signal frequency from the user interface 110. The micro controller 100 may also be part of the main DSP processor of a main application, for example a phone application. The micro controller 100 sets the frequency of the RF signal oscillator 20 in unit 10. The relation between the supply current and the radiated power is known by measurement and the micro controller 100 is able to set the variable gain amplifier 40 in that way that the radiated power is constant over the frequency range. For example a phone contains a short capacitive antenna element of 40 mm length. The radiating field strength at 3 meter of this antenna at a transmit frequency of 95 Mhz is 52.9 dbuV/meter for 5.5 mA supply current. This relationship can be measured during development.

For the hardware shown in FIG. 3 the micro controller 100 is sets the output power of the variable gain amplifier 40. In this embodiment the supply current is 5.5 mA. With this setting the radiated field strength at 3-meter distance can be found in Table 4.

TABLE 4

| Frequency [MHz] | Radiated field strength [dbuV/meter] at 3 meter distance |
|---|---|
| 80 | 52.9 |
| 90 | 53.9 |
| 100 | 54.8 |
| 110 | 55.6 |

If for FIG. 3, the output power of the variable power amplifier is adapted per frequency for a supply current that is slightly linear increasing with the frequency, the radiated field strength over frequency is more or less equalized. Example values for the hardware of FIG. 3 can be found in Table 5.

TABLE 5

| Frequency [MHz] | Antenna current [mA] | Radiated field strength [dbuV/meter] At 3 meter distance |
|---|---|---|
| 80 | 1 | 52.9 |
| 90 | 0.9 | 53 |
| 100 | 0.8 | 52.8 |
| 110 | 0.7 | 52.5 |

Figure 4:
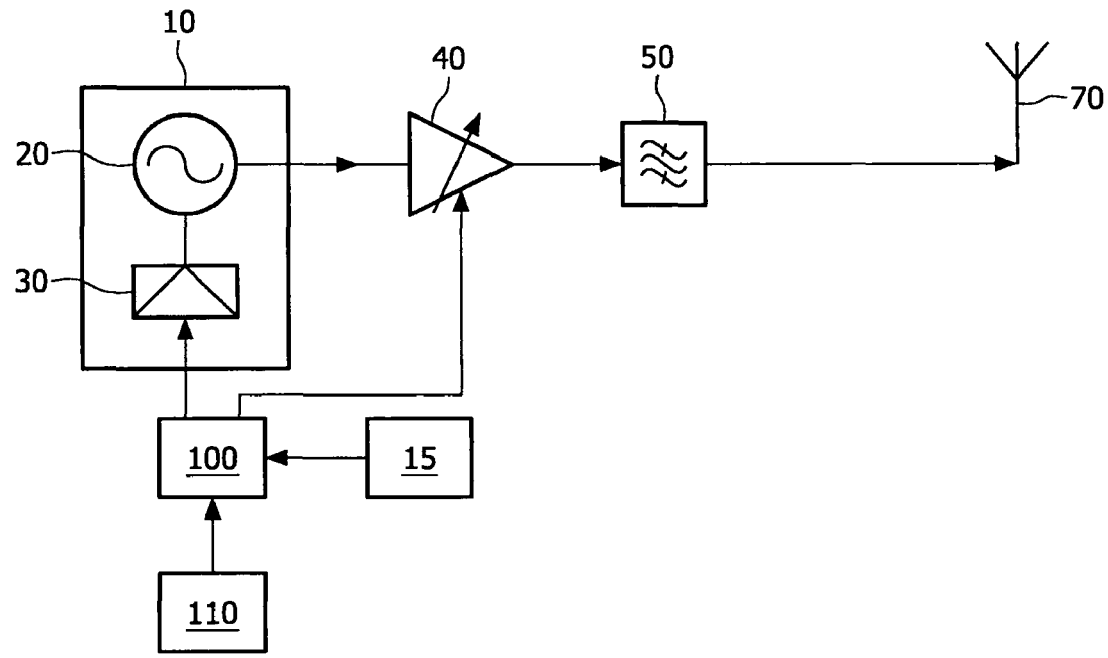
FIG. 4 depicts another embodiment of an equalizer according to the invention.

In FIG. 4, the micro controller 100 has receives the transmit frequency from the user interface 110. The micro controller 100 can also be part of the main DSP processor of a main application, for example phone application. The micro controller 100 sets the frequency of the Rf signal oscillator 20 in unit 10. Micro controller 100 contains a memory with a table that gives a conversion between the output power of the variable power amplifier and the radiated power. The micro controller 100 is now able to set the variable gain amplifier 40 in that way that the radiated power is constant over the frequency range. For example a phone contains a short capacitive antenna element of 40 mm length. The relationship between output power and radiated field strength can be found in Table 6. The required settings for the output power amplifier can be measured during development.

TABLE 6

| Frequency [MHz] | Output power [mW] | Radiated field strength [dbuV/meter] at 3 meter distance |
|---|---|---|
| 80 | 1.6 | 52.9 |
| 90 | 1.44 | 53 |
| 100 | 1.28 | 52.8 |
| 110 | 1.12 | 52.5 |

The second method requires fewer components but does suffer from antenna parameter changes during use like for example hand effects or environmental situations. Usually the antenna reactance is changed. This effect is partially compensated for when the first method is used.

Figure 5:
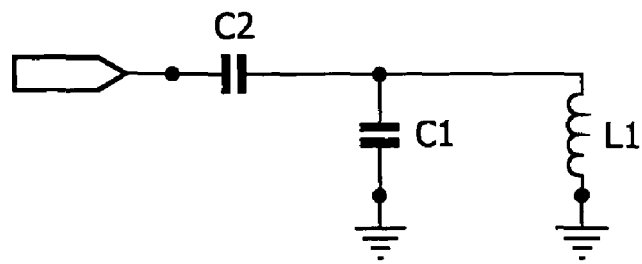
FIG. 5 depicts a filter circuit for a loop antenna according to an embodiment of the invention.

In FIG. 5 L1 is the small loop antenna, which is tuned to the center of the first frequency band with C1 i.e. they determine the first resonant frequency. The small loop antenna L1 in combination with C2 is the second resonant circuit having the purpose of increasing the current in the lower band frequencies. The second resonance frequency, defined by L1 and C2, can be chosen in that way that the resulting current curve has a shape that compensates for the shape of the E-field degradation due to the frequency performance of the small loop antenna L1.

Figure 7:
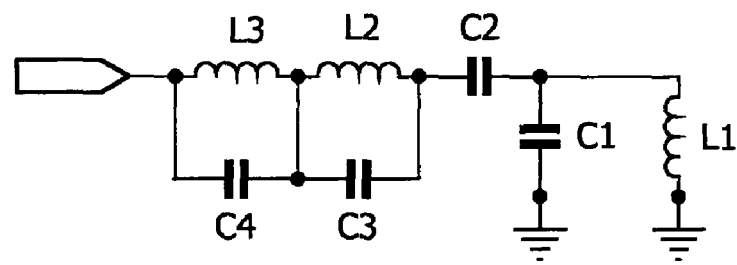
FIG. 7 depicts another filter circuit for a loop antenna according to another embodiment of the invention.

Additionally, the filter circuit may comprise band—reject filters having their resonant frequencies in the frequency bands allocated to higher wireless frequency standards, as shown in FIG. 7. Signals situated in the higher frequency bands may influence the sensitivity of the transmitter and may produce interferences with a transmitter comprising such an antenna as a GSM telephone. In FIG. 7 two frequency bands are suppressed i.e. one determined by L2 and C3 and another determined by L3 and C4. These frequency bands might be e.g. 800 to 900 MHz and 1700 to 1900 MHz. Additional frequency bands can be suppressed if more LC tank circuits are provided.

Figure 6:
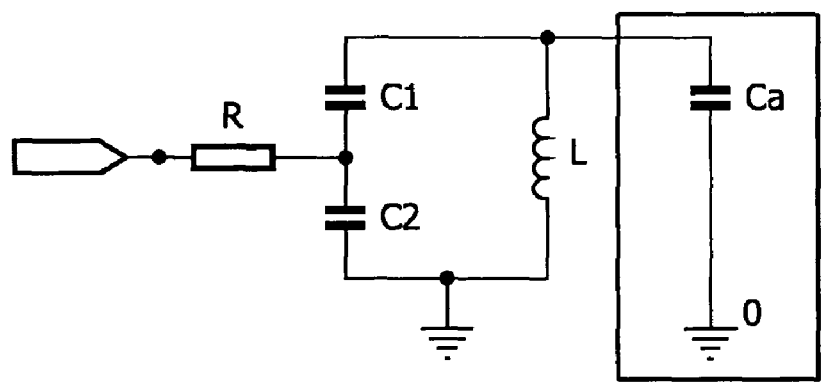
FIG. 6 depicts a filter circuit for a capacitive antenna according to an embodiment of the invention.

If we consider a capacitive antenna, then the feeding circuit may be as the circuit shown in FIG. 6. For the capacitive antenna, the current necessary at lower frequencies is higher than that necessary at higher frequencies in order to provide a quasi-constant emitted power. FIG. 6 shows the feeding network that provides an equalization of the electromagnetic field. There is provided a second resonance, outside the frequency band of interest and a first resonance in the frequency band of interest. L, C1 and the antenna capacitance Ca mainly define the second resonance, while L, Ca, C1 and C2 mainly define the first resonance. The second resonance is chosen below the frequency band so that there is an increase of antenna current, the current through Ca. Resistor R has the purpose to lower the quality factor at the second resonance. In this way the shape of the decreasing current in function of frequency (in the frequency band of interest) can compensate better for the frequency dependence of the small capacitive antenna.

Such a combination of short antenna and feeding network can be easily integrated into a mobile phone. For example the short antenna can be a printed conducting track on a Flex material, which is very thin, and fixed at the inner side of the plastic cover. In this way the antenna occupies no additional volume.

Additional parallel circuits can be inserted between the supply source and the supply network for rejecting unwanted signals that are available at the output of the power amplifier. This is required to prevent that the spurious signals from the power amplifier interferes with the mobile phone's receiver and other present receiver functions like for example the GPS receiver.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. An equalizer system for emitting a quasi-constant power output radio frequency (RF) signal in a first frequency band, the system comprising:
   - a programmable RF signal generator configured to provide a modulated signal;
   - a variable gain amplifier configured to receive the modulated signal and to generate an RF signal to a small capacitive antenna;
   - a sensing devices configured to provide a sensing signal which is at least a one of a signal proportional with the RF signal and a signal proportional with a supply current of the variable gain amplifier;
   - a user interface configured to determine an initial RF frequency signal;
   - an adjusting circuit configured to provide a control signal to the variable gain amplifier based on the initial RF frequency signal and the sensing signal, the adjusting circuit comprising an arithmetic unit configured to calculate a value of the control signal; and
   - a filter circuit configured to receive the RF signal and to provide a further RF signal to the antenna, the filter circuit comprising a first resonant circuit at a first resonant frequency inside the first frequency band and a second resonant circuit at a second resonant frequency outside the first frequency band to provide the RF signal having a substantial same power in the first frequency band;
   - wherein the filter circuit comprises a first capacitor in series with a second capacitor in which the series combination is configured in parallel with an inductor that is parallel with the small capactive antenna, the inductor, the first capacitor and the capacitive antenna is configured to determine the second resonance frequency and the inductor, the first capacitor, the second capacitor and the capacitive antenna is configured to determine the first resonant frequency.

2. The equalizer system as claimed in claim 1, wherein the adjusting circuit comprises a memory circuit is configured to memorize the control signal corresponding to specific RF signals selected via the user interface.

3. The equalizer system as claimed in claim 1 further comprising an analog to digital converter coupled to the adjusting circuit and configured to convert the sensing signal into a digital code.

4. The equalizer system as claimed claim 1, further comprising band-reject filters having a resonant frequency in the frequency bands allocated to higher wireless frequency standards than the RF signal band.

5. A transmitter included in a portable device comprising the equalizer system as claimed in claim 1, further comprising a signal source configured to provide a transmission signal to the antenna.

* * * * *